(12) United States Patent
Bardsley et al.

(10) Patent No.: US 8,941,439 B2
(45) Date of Patent: Jan. 27, 2015

(54) DIFFERENTIAL CHARGE REDUCTION

(71) Applicant: Analog Devices, Inc., Norwood, MA (US)

(72) Inventors: Scott G. Bardsley, Gibsonville, NC (US); Peter Derounian, Greensboro, NC (US); Franklin M. Murden, Roan Mountain, TN (US)

(73) Assignee: Analog Devices, Inc., Norwood, MA (US)

(*) Notice: Subject to any disclaimer, the term of this patent is extended or adjusted under 35 U.S.C. 154(b) by 97 days.

(21) Appl. No.: 13/769,096

(22) Filed: Feb. 15, 2013

(65) Prior Publication Data
US 2014/0232460 A1    Aug. 21, 2014

(51) Int. Cl.
| H03F 1/02 | (2006.01) |
| H03F 3/45 | (2006.01) |
| H03F 1/32 | (2006.01) |
| H03K 17/00 | (2006.01) |
| H03M 1/08 | (2006.01) |
| H03M 1/12 | (2006.01) |

(52) U.S. Cl.
CPC .......... *H03F 3/45179* (2013.01); *H03F 1/3211* (2013.01); *H03K 17/005* (2013.01); *H03M 1/0863* (2013.01); *H03M 1/1225* (2013.01)
USPC .......................................................... 330/9

(58) Field of Classification Search
CPC ....................................................... H03F 1/02
USPC ............................................... 330/9; 327/124
See application file for complete search history.

(56) References Cited

U.S. PATENT DOCUMENTS

| 5,703,589 | A | 12/1997 | Kalthoff et al. |
| 6,201,835 | B1 | 3/2001 | Wang |
| 7,019,679 | B2 | 3/2006 | Mulder et al. |
| 7,167,029 | B2 | 1/2007 | Soeraasen |
| 8,026,760 | B1 * | 9/2011 | Prasad ............................... 330/9 |
| 8,368,576 | B2 | 2/2013 | Bardsley et al. |
| 2003/0146786 | A1 | 8/2003 | Gulati et al. |
| 2005/0035810 | A1 | 2/2005 | Mulder et al. |
| 2012/0274497 | A1 | 11/2012 | Bardsley et al. |
| 2013/0335131 | A1 * | 12/2013 | Ceballos et al. .............. 327/337 |

OTHER PUBLICATIONS

Extended European Search Report of Apr. 15, 2014 for European Patent Application No. 14152953.7 filed Jan. 28, 2014. 9 pages.

* cited by examiner

*Primary Examiner* — Steven J Mottola
(74) *Attorney, Agent, or Firm* — Knobbe, Martens, Olson & Bear, LLP

(57) ABSTRACT

One embodiment relates to an apparatus configured to cancel charge injected on a node of a differential pair of nodes. A dummy circuit element can inject charge on an inverted node to cancel charge injected on a non-inverted node by a switch when the switch is switched off. In addition, another dummy circuit element can inject charge on the non-inverted node to cancel charge injected on the inverted node by another switch when the other switch is switched off. These dummy circuits elements can be cross-coupled.

24 Claims, 6 Drawing Sheets

US 8,941,439 B2

DIFFERENTIAL CHARGE REDUCTION

TECHNICAL FIELD

The disclosed technology relates to electronic systems, and, more particularly, to circuits configured to compensate for charge injected on a differential node.

DESCRIPTION OF THE RELATED TECHNOLOGY

Electronic systems can include sensitive differential nodes, such as inputs to a differential amplifier. For example, inputs to a differential amplifier can be driven by one of a plurality of interleaved channels of an analog-to-digital converter (ADC) while the remaining channels of the ADC are electrically decoupled from the inputs to the differential amplifier. Given the sensitive nature of the inputs to the amplifier, it can be advantageous to prevent these inputs from being subject to noise or other unwanted injections of charge. Additionally, the differential inputs to the amplifier can be designed such that they are matched to each other and are subject to similar environments.

However, the differential amplifier inputs can still experience unwanted injections of charge. This can reduce the accuracy of an output of the amplifier. Some of these unwanted injections of charge can affect one of the differential inputs instead of the other differential input or affect one of the differential inputs to a greater degree than the other differential input.

SUMMARY OF CERTAIN INVENTIVE ASPECTS

One aspect of this disclosure is an apparatus that includes a first switch, a second switch, a first dummy circuit element, and a second dummy circuit element. The first switch is configured to receive a first differential input and to provide the first differential input to a first node when switched on. The a second switch is configured to receive a second differential input and to provide the second differential input to a second node when switched on. The first node and the second node are a differential pair of nodes. The first dummy circuit element is configured to inject charge on the second node to cancel charge injected on the first node by the first switch when the first switch is switched off. The second dummy circuit element is configured to inject charge on the first node to cancel charge injected on the second node by the second switch when the second switch is switched off.

Another aspect of this disclosure is an apparatus that includes an amplifier and a plurality of channels. The amplifier includes a non-inverted input and an inverted input. Each of the plurality of channels includes a pair of input switches and a pair of dummy circuit elements. The pair of input switches includes a first switch and a second switch. The first switch is configured to receive a first switch input, provide the first switch input to the non-inverted input of the amplifier when switched on, and to electrically isolate the non-inverted input of the amplifier from the first switch input when switched off. The second switch is configured to receive a second switch input, provide the second switch input to the inverted input of the amplifier when switched on, and to electrically isolate the inverted input of the amplifier from the second switch input when switched off. The pair of dummy circuit elements is cross coupled between the inputs of the pair of amplifier input switches and the inputs of the amplifier. Each dummy circuit element of the pair of dummy circuit elements has substantially the same capacitance as the first switch when the first switch is switched off. The pair of amplifier input switches of one of the plurality of channels is configured to provide charge to the non-inverted and the inverted inputs of the amplifier, when the pair of amplifier input switches of the other of the plurality of channels are switched off.

Yet another aspect of this disclosure is an electronically-implemented method of reducing differential charge. The method includes biasing a first switch to electrically isolate a non-inverting node from an input of the first switch. The method also includes coupling charge on an inverting node to at least partially cancel charge injected on the non-inverting node by the first switch, while the first switch is biased to electrically isolate the non-inverting node from the input of the first switch. The non-inverting node and the inverting node comprise nodes of a differential pair.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1A:
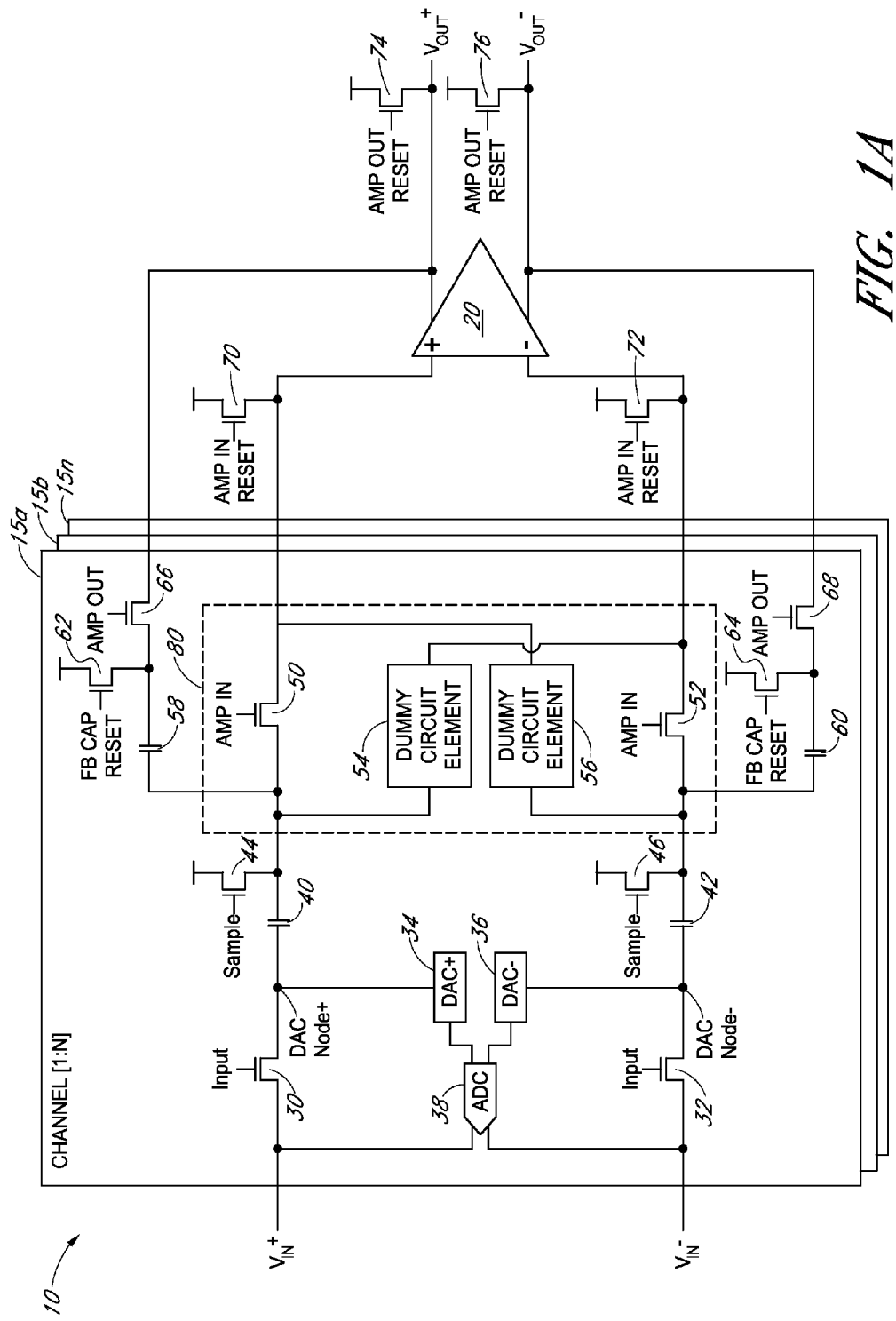
FIG. 1A is a schematic diagram illustrating an interleaved analog-to-digital converter (ADC) stage having a plurality of channels, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals indicate identical or functionally similar elements.

Charge injected on one node of a set of differential nodes can cause errors in circuit functionality. For instance, unwanted charge injected on a non-inverted input of a differential amplifier can lead to the amplifier sensing a different difference in charge between the non-inverted input node and an inverted input node of the differential amplifier. Such unwanted charge can be injected, for example, due to a voltage glitch coupling to the non-inverted input via a switch biased to a cutoff region of operation.

Generally described, aspects of this disclosure relate to canceling charge injected on one node of a differential pair of nodes. While the examples discussed herein may be described in the context of an unwanted single ended charge for illustrative purposes, the principles and advantages described herein can apply to an unwanted differential charge, which can refer to the combination of single ended charges injected on each of the single ended nodes. According to one or more features described herein, charge injected on one node of a pair of sensitive differential nodes by a switch when the switch is off can be cancelled by a dummy circuit element injecting approximately the same change on the other node of the pair of sensitive differential nodes. This can bring the net differential charge injected on the pair of differential nodes through the switch and the dummy circuit element to approximately zero. As such, this can compensate for a voltage glitch or other unwanted injection of charge through the switch on the one node of the pair of sensitive differential nodes. Dummy circuit elements can be cross coupled across the sensitive differential nodes and differential inputs to switches that are configured to selectively electrically couple to the sensitive differential nodes. The dummy circuit elements can comprise switches that are closely matched to the switches that are configured to selectively electrically couple the differential inputs to the sensitive differential nodes. In one embodiment, the dummy circuit elements can comprise switches that are always biased to the cutoff region of operation.

Such differential charge cancellation can be implemented, for example, in an ADC. With reference to FIG. 1A, an illustrative ADC stage 10 will be described. The ADC stage 10 can be implemented as part of an ADC, such as a pipelined ADC, in an integrated circuit. For instance, the ADC stage 10 can be implemented with any combination of features described in U.S. Pat. No. 8,368,576, assigned to the assignee of the present application, issued Feb. 5, 2013, titled "PIPELINED ANALOG-TO-DIGITAL CONVERTER," the entire technical disclosure of which is hereby incorporated by reference in its entirety herein. The ADC stage 10 can be a multiplying digital-to-analog converter (MDAC) stage in certain embodiments. The ADC stage 10 can be one of a plurality of sequentially cascaded stages that are substantially the same. According to one embodiment, the ADC stage 10 can be included in a multi-bit (e.g., 12 bit) ADC having a sample rate of at least about 1 gigasample-per-second (GSPS). In certain embodiments, the sample range of the ADC can be selected in the range from about 1 GSPS to 10 GSPS, such as about 2.5 GSPS.

The ADC stage 10 can include a plurality of channels 15a-15n. Any suitable number of channels 15a-15n can be implemented. For example, 2 to 16 channels can be included in the ADC stage 10. In some of these implementations, 3 or 4 channels can be included in the ADC stage 10. The channels 15a-15n can be substantially the same to each other in certain implementations except that they can receive different control signals. The channels 15a-15n can be coupled to each other in parallel. In particular, each channel can receive differential inputs Vin+ and Vin− and be selectively electrically coupled to the differential inputs of the amplifier 20 via amplifier input switches in the channels in the embodiment illustrated in FIG. 1A. Differential inputs of an amplifier 20 can be selectively electrically coupled to circuit elements in one of the plurality of channels 15a-15n at a time via amplifier input switches. The amplifier 20 can be any suitable amplifier configured to receive differential input signals. The differential inputs can be full swing and/or low swing signals.

Each of the illustrated channels 15a-15n includes input switches 30 and 32, a positive digital-to-analog converter (DAC) 34, a negative DAC 36, an ADC component 38, input capacitors 40 and 42, sample switches 44 and 46, amplifier input switches 50 and 52, dummy circuit elements 54 and 56, feedback capacitors 58 and 60, feedback cap reset switches 62 and 64, and amplifier output switches 66 and 68. As shown in FIG. 1A, the illustrated switches can be field effect transistors. In other embodiments, different types of switches can be used to implement one or more of the switches illustrated in FIG. 1A. It will be understood that any of the channels 15a-15n can include any combination of the circuit elements illustrated in FIG. 1A. Moreover, any of the channels 15a-15n can also include one or more other circuit elements.

Figure 1B:
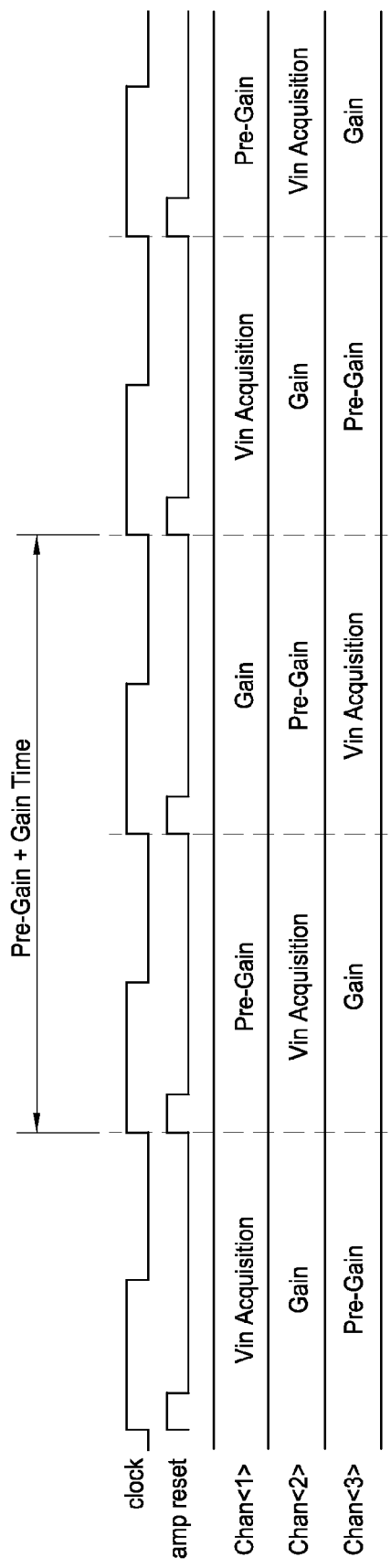
FIG. 1B is a timing diagram of an implementation of the ADC stage of FIG. 1A.

One or more of the plurality of channels 15a-15n can operate concurrently in different states such that they form part of a time interleaved ADC stage. FIG. 1B is a timing diagram of an implementation of the ADC stage 10 of FIG. 1A, which illustrates states of operation of three different channels of the plurality of channels 15a-15n. Channels can cycle through the modes of operation in accordance with the timing diagram of FIG. 1B in one embodiment. As shown in the timing diagram of FIG. 1B, each channel can operate in a particular mode of operation for one clock cycle according to certain embodiments. As one example, a first channel can operate in a Vin Acquisition mode, while a second channel operates in a Pre-Gain mode and a third channel operates in a Gain mode.

At the beginning of each clock cycle, the amplifier inputs and outputs can be reset. In one or more channels of the ADC stage 10 illustrated in FIG. 1A, the amplifier input reset switches 70 and 72 can be turned on when the amp_reset signal in FIG. 1B is asserted (e.g., high in FIG. 1B) to reset the differential inputs of the amplifier 20. The amplifier output reset switches 74 and 76 can also be turned on when the amp_reset signal in FIG. 1B is asserted to reset the differential outputs of the amplifier 20. As shown in FIG. 1B, the amp_reset signal can be asserted for a relatively small portion of the clock cycle.

One channel can operate in the Vin Acquisition mode by turning on the input switches 30 and 32, the sample switches 44 and 46, and the feedback cap reset switches 62 and 64. When the input switches 30 and 32 are on, they can cause the input capacitors 40 and 42 to be charged with the non-inverted input signal Vin+ and the inverted input signal Vin−, respectively. The other switches illustrated in the example channel of FIG. 1A can be off during the Vin Acquisition mode of operation. During the Vin Acquisition mode, a channel is electrically decoupled from the inputs of the amplifier 20.

Another channel can operate in a Pre-Gain mode of operation by activating one or more switches in the positive and negative DACs 34 and 36, respectively. This can cause a DAC Node+ and/or a DAC Node− to be charged. In one embodiment, the ADC component 38 can have a three bit output that can be used to drive one of 8 different switches in the DACs 34 and 36. In one embodiment, the input capacitors 40 and 42 may each be partitioned into 8 capacitors having approximately equal capacitances. In this embodiment, charge from each of these 8 capacitors can be driven to the DAC Note+ or DAC Node− by the switches in DACs 34 and 36 according to the state of ADC component 38. The ADC component 38 can be, for example, a flash ADC. The other switches illustrated in the example channel of FIG. 1A can be off during the Pre-Gain mode of operation. During the Pre-Gain mode, a channel is electrically decoupled from the inputs of the amplifier 20.

Yet another channel can operate in a Gain mode by turning on the amplifier input switches 50 and 52. When the amplifier input switches 50 and 52 and the amplifier output switches 66 and 68 are on, they can drive the differential inputs of the amplifier 20. During the Gain mode, the charge stored in input capacitors 40 and 42 can be transferred to the feedback capacitors 58 and 60, respectively. In addition, one or more switches in the positive and negative DACs 34 and 36, respectively, can be on during the Gain mode in one embodiment. The other switches illustrated in the example channel of FIG.

1A can be off during the Gain mode. During the Gain mode, a channel is electrically connected to the inputs of the amplifier 20.

At the same time, other channels of the plurality of channels can operate in a known state. For example, the other channels can operate in an offline and/or idle state in one embodiment.

The ADC stage 10 can be configured such that the amplifier input switches 50 and 52 can be turned on for only one channel of the plurality of channels 15a-15n at a time. As such, the amplifier input switches 50 and 52 in one channel can drive the differential inputs of the amplifier 20 while the amplifier input switches 50 and 52 for all of the other channels are biased to be in an off state to electrically isolate the differential inputs of the amplifier 20 from the circuit elements of the other channels. The amplifier input switches 50 and 52 allow the plurality of channels 15a-15n to share a common amplifier 20 by enabling circuit elements to be electrically coupled or decoupled from the differential inputs to the amplifier 20.

However, charge can be injected on the differential inputs of the amplifier 20 via one or more amplifier input switches 50 and/or 52 that are in the off state. As one example, a first channel can operate in the Vin Acquisition mode, while a second channel is operating in the Pre-Gain mode and a third channel is operating in the Gain mode. While the amplifier input switches 50 and 52 in the third channel are driving the inputs of the amplifier 20, the input capacitors 40 and 42 can be charged in the first channel by a high frequency large swing differential inputs Vin+ and Vin−, respectively. Some of this charge from charging one of the input capacitors 40 or 42 can be fed through the amplifier input switch 50 or 52, respectively, in the first channel even though both of the amplifier switches 50 and 52 are biased to electrically isolate the differential inputs of the amplifier 20 from the input capacitors 40 and 42 of the first channel. At the same time that charge is being injected on one differential input of the amplifier 20, the other differential input of the amplifier 20 may not experience a significant charge injection. Consequently, the charge injection can cause an error in the difference in potential between the non-inverted and inverted inputs of the amplifier. In one embodiment, an amplifier input switch can experience a glitch that results in a difference in potential on the order of 100s of millivolts between sources of the amplifier input switches 50 and 52, which can inject in on the order of 10 microvolts (e.g., about 10 to 50 microvolts) of error in the corresponding inputs of the amplifier 20. In precision ADCs with closed loop amplifiers such as shown in FIG. 1A, this magnitude of error can be large enough to significantly degrade the system performance. As such, unwanted charge injection on one of the differential inputs to the amplifier 20 can cause an output of the amplifier 20 to be inaccurate and/or corrupted. Such differential charge injection can be compensated for and/or cancelled according to the principles and advantages described herein.

Charge can also be injected back into one or more channels through via amplifier input switches 50 and/or 52 of the one or more channels that are in the off state. For example, a third channel can create a glitch that couples back into the first and second channels. In this example, the amplifier input switches 50 and 52 in the third channel turning on to electrically connect the third channel to inputs of the amplifier 20 can create a glitch that couples through the amplifier input switches 50 and/or 52 of the first channel and/or the second channel. This glitch can create a signal-dependent sample voltage error in the first channel and/or second channel. Such a signal-dependent sample voltage error can subsequently cause an output of the amplifier 20 to be inaccurate and/or corrupted.

A differential charge cancellation circuit 80 shown by a dashed box in FIG. 1 can compensate for injections of charge on one node of a differential pair of nodes. The differential charge cancellation circuit 80 can include the amplifier input switches 50 and 52 and the dummy circuit elements 54 and 56. Within each channel of the plurality of channels 15a-15n, the dummy circuit element 54 is configured to reduce a difference in charge on differential inputs of the amplifier 20 injected by the amplifier input switch 50 when the amplifier input switch 50 is switched off. Similarly, the dummy circuit element 56 is configured to reduce a difference in charge on differential inputs of the amplifier 20 injected by the amplifier input switch 52 when the amplifier input switch 52 is switched off. As illustrated in FIG. 1A, the dummy circuit element 54 has a first end coupled to an input of the first amplifier input switch 50 and a second end coupled to the inverted input of the amplifier 20. As also illustrated in FIG. 1A, the dummy circuit element 56 has a first end coupled to an input of the second amplifier input switch 52 and a second end coupled to the non-inverted input of the amplifier 20. As such, the dummy circuit elements 54 and 56 can be considered to be cross-coupled. The first dummy circuit element 54 can inject a charge on the inverted input of the amplifier 20 to cancel the charge injected on the non-inverted input of the amplifier 20 by the first amplifier input switch 50 when the first amplifier input switch 50 is off. Similarly, the second dummy circuit element 56 can inject a charge on the non-inverted input of the amplifier 20 to cancel the charge injected on the inverted input of the amplifier 20 by the second amplifier input switch 52 when the second amplifier input switch 52 is off. For instance, the dummy circuit elements can have capacitances that are matched to the capacitances of the amplifier input switches when the amplifier input switches are off, such that a dummy circuit element can inject approximately the same amount of charge on an input of the amplifier 20 as does a turned off amplifier input switch on the other differential input of the amplifier 20, which results in charge cancellation. Since approximately the same charge is injected on the inverting and non-inverting input nodes of the amplifier 20, this 'cancellation' in effect causes the net differential charge injected to the input nodes of the amplifier 20 to be close to zero. While there can be a common mode glitch to the differential inputs of the amplifier 20 by including the dummy circuit elements 54 and 56 in the channels, this should not significantly affect the output of the amplifier 20.

A dummy circuit element can refer to a circuit element biased to be in only one state, such as an off state. For instance, a dummy circuit element can be implemented by a field effect transistor having a gate biased to a power rail voltage or to a voltage reference. The biasing can be direct, such as by a short circuit, or can be indirect via additional circuit elements, such as resistors. For example, a dummy NMOS device can have a gate biased to a ground reference voltage. Similarly, a dummy PMOS device can have a gate biased to a power supply voltage, such as Vdd. The field-effect transistors (FETs) or "transistors" described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics. As another example, a dummy circuit element can be a passive circuit element, such as a capacitor.

A dummy circuit element can be matched to a corresponding functional circuit element. As one example, a dummy circuit element can have a capacitance matched to a source-to-drain capacitance that a functional field effect transistor has while operating in an off state. In one embodiment, the dummy circuit element can be a substantially identical instantiation of a functional transistor, but is instead biased in a cutoff region of operation. Substantially identical instantiations are relatively simple to implement in an integrated circuit.

Figure 2A:
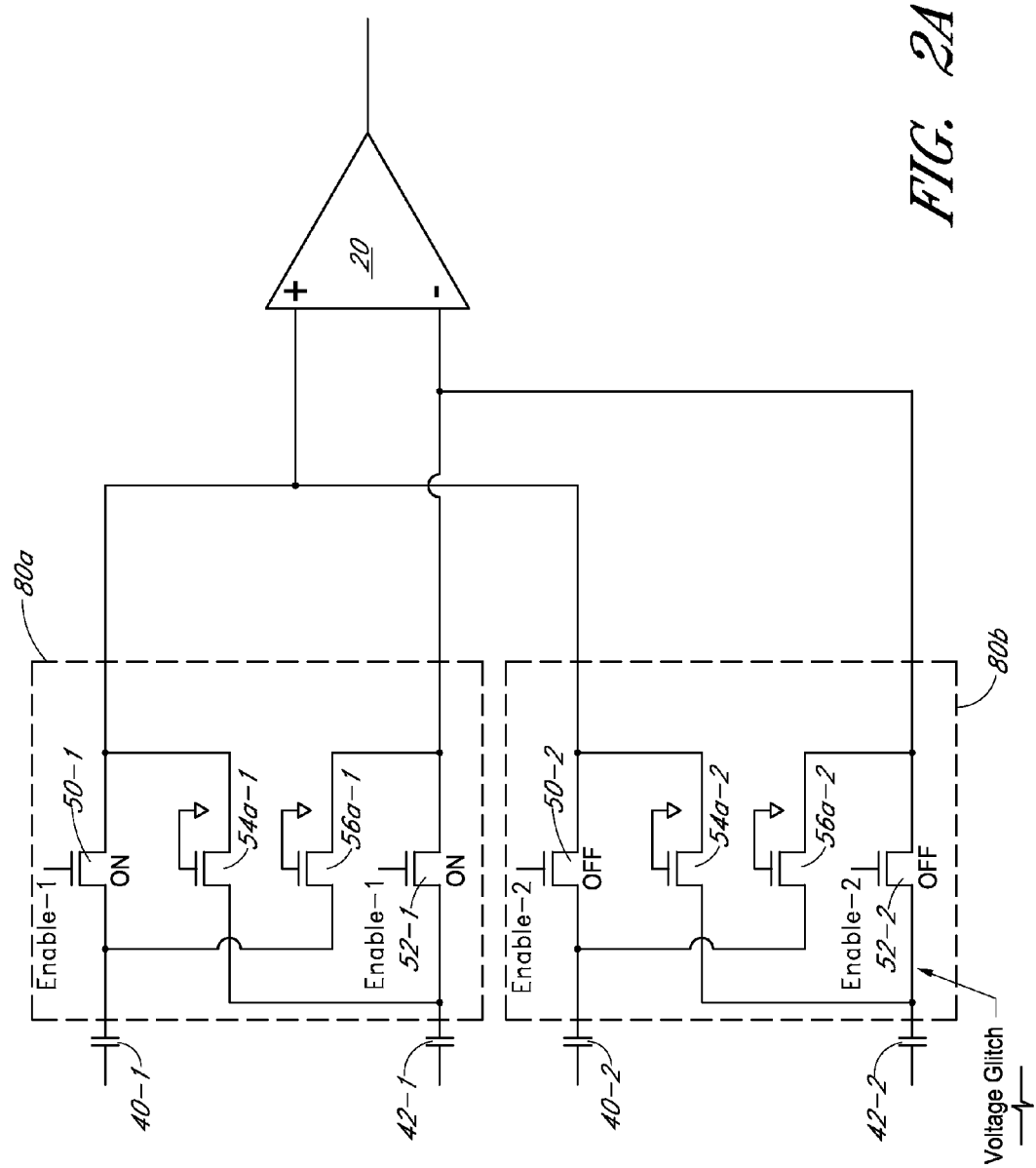
FIGS. 2A-2C are schematic diagrams that illustrate differential charge cancellation circuits with dummy circuit elements, according to various embodiments.
Figure 2B:
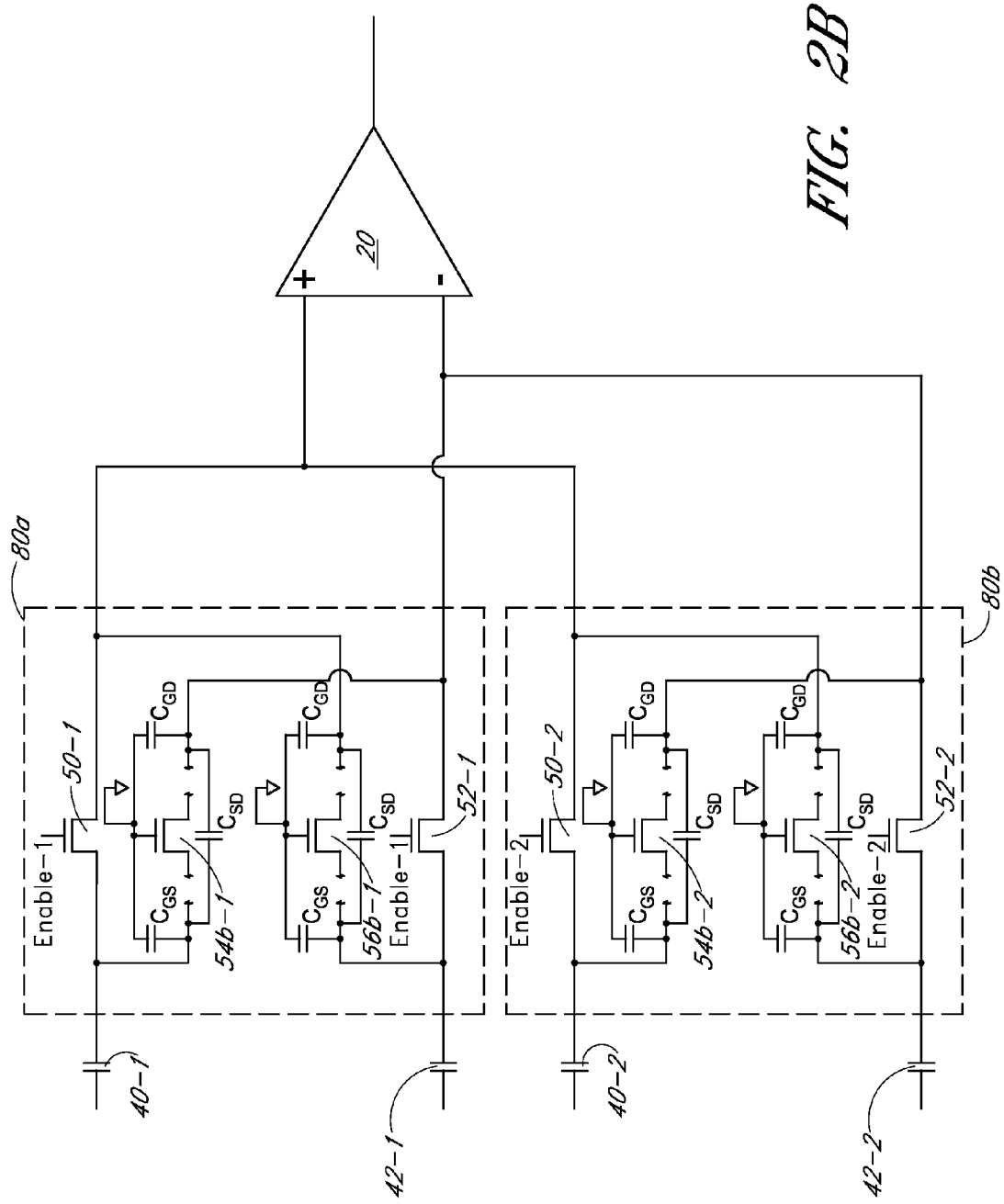
Figure 2C:
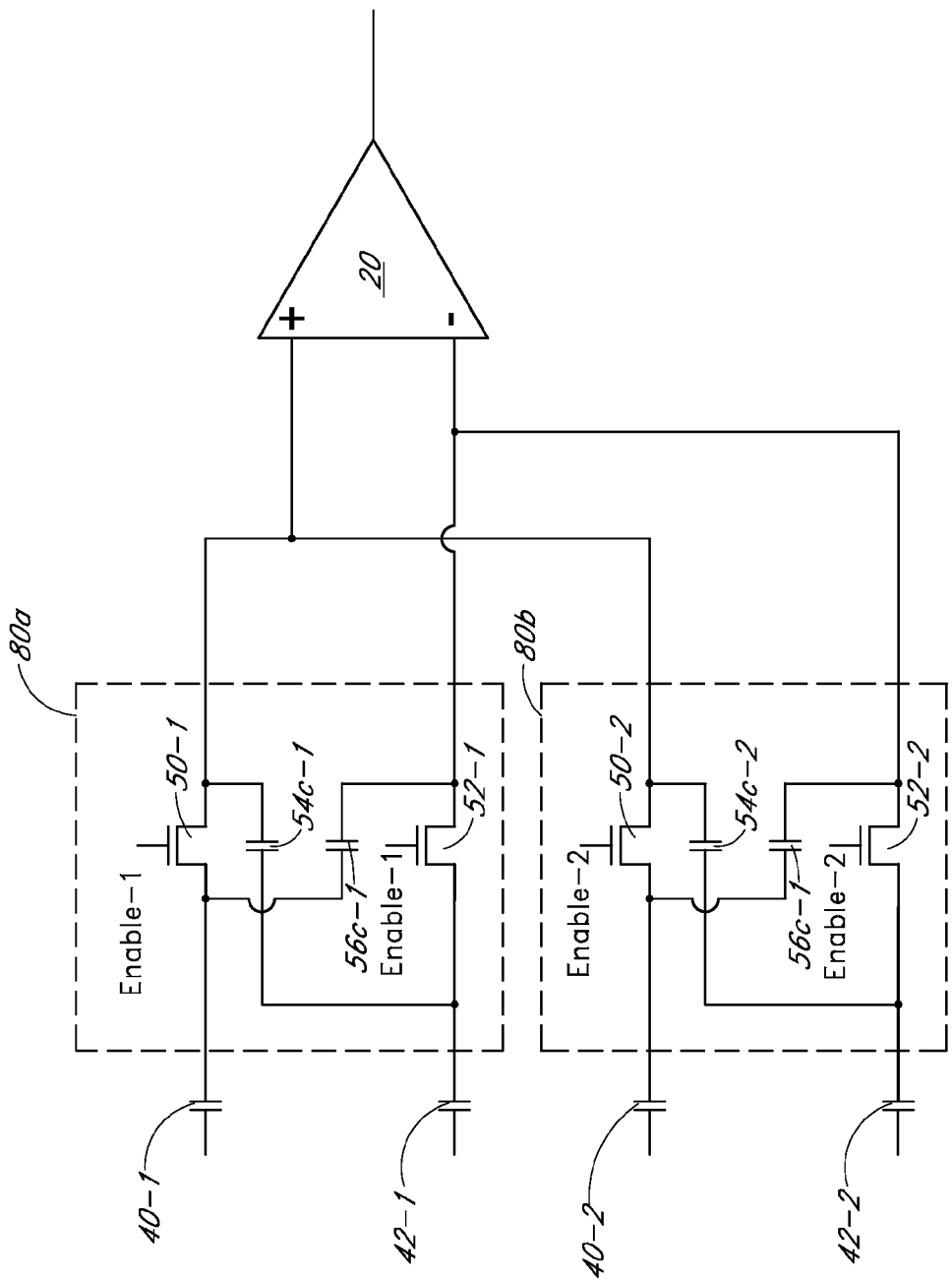

FIGS. 2A-2C illustrate various embodiments of change cancellation circuits that include dummy circuit elements. With reference to these figures, different examples of dummy circuit elements for differential charge cancellation will be described. Any of the principles and advantages of the differential charge cancellation circuits 80a-80c can be implemented in the differential charge cancellation circuit 80 of FIG. 1A. For instance, it will be understood that any combination of features of the dummy circuit elements described with reference to FIGS. 2A-2C can be applied to the embodiment illustrated in FIG. 1A.

In FIG. 2A, differential charge cancellation circuits 80a and 80b are illustrated in combination with an amplifier 20. As illustrated, the dummy circuit elements 54a-1, 56a-1, 54a-2, and 56a-2 are each implemented by a field effect transistor with a gate biased to a power rail voltage or reference voltage. More specifically, as illustrated, the dummy field effect transistors are NMOS transistors that each have a gate biased to ground or to a ground reference. As such, each of the dummy field effect transistors is always biased to the cutoff region of operation. The dummy field effect transistors 54a-1, 56a-1, 54a-2, and 56a-2 can be substantially the same sizes as corresponding amplifier input transistors 50-1, 52-1, 50-2, and 52-2, respectively. Moreover, the layout of the dummy field effect transistors can be matched to the layout of the amplifier input transistors so that their source-to-drain capacitances are relatively closely matched.

As illustrated in FIG. 2A, the first differential charge cancellation circuit 80a can include amplifier input switches 50-1 and 52-1 and dummy circuit elements 54a-1 and 56a-1. The first amplifier input switch 50-1 can have an input coupled to a first input capacitor 40-1 and the second amplifier input switch 52-1 can have an input coupled to a second input capacitor 42-1. More specifically, the first input capacitor 40-1 can have a first end configured to receive a first differential input signal and a second end electrically connected to a source of the first amplifier input switch 50-1. The second input capacitor 42-1 can have a first end configured to receive a second differential input signal and a second end electrically connected to a source of the second amplifier input switch 52-1. A gate of the first amplifier input switch 50-1 can receive a control signal Enable-1 and selectively electrically couple the second end of the first input capacitor 40-1 to non-inverted input of the amplifier 20 in response to the control signal Enable-1. A gate of the second amplifier input switch 52-1 can also receive the control signal Enable-1 and selectively electrically couple the second end of the second input capacitor 42-1 to inverted input of the amplifier 20 in response to the control signal Enable-1. The dummy circuit elements 54a-1 and 56a-1 can be cross coupled. As illustrated in FIG. 2A, the first dummy circuit element 54a-1 can be a first dummy field effect transistor having a gate biased to a power rail voltage, a source electrically coupled to the source of the second amplifier input switch 52-1, and a drain electrically coupled to the non-inverted input of the amplifier 20. Similarly, the second dummy circuit element 56-1 can be a second dummy field effect transistor having a gate biased to the power rail voltage, a source electrically coupled to the source of the first amplifier input switch 50-1, and a drain electrically coupled to the inverted input of the amplifier 20.

The second differential charge cancellation circuit 80b can be substantially the same as the first differential charge cancellation circuit 80a, except the inputs of the amplifier input switches 50-2 and 52-2 can be electrically coupled to different input capacitors (e.g., a third input capacitor 40-2 and a fourth input capacitor 42-2) and the amplifier input switches 50-2 and 52-2 can activate in response to a different control signal that the amplifier input switches 50-1 and 52-1 (e.g., Enable-1 and Enable-2 in the illustrated embodiment).

One example of differential charge cancellation will now be described with reference to FIG. 2A. When the amplifier input switches 50-1 and 52-1 of the first differential charge cancellation circuit 80a are on, the amplifier input switches 50-2 and 52-2 of the second differential charge cancellation circuit 80b are off. A voltage glitch on the source of the second amplifier input switch 52-2 can inject charge to the inverted input of the amplifier 20 even when the second amplifier input switch 52-2 is off. For instance, the fourth input capacitor 42-2 can charge up relatively fast and the second amplifier input switch 52-2 can feed through at least a portion of that charge to the inverted input of the amplifier 20. The dummy field effect transistor 54-a2 can inject substantially the same charge on the non-inverted input of the amplifier 20 to thereby cancel the charge differential between the non-inverted and inverted inputs of the amplifier 20 that result from the voltage glitch. Consequently, the amplifier 20 can more accurately sense the differential between the charges driven by the amplifier input switches 50-1 and 52-1 of the first differential charge cancellation circuit 80a that are on.

In the embodiment illustrated in FIG. 2B, the dummy circuit elements are implemented differently than in the embodiment of FIG. 2A. Otherwise, the circuits illustrated in FIG. 2B can operate in substantially the same manner as the circuits described earlier in connection with FIG. 2A. In FIG. 2B, the illustrated capacitances are parasitic capacitances of the dummy circuit elements rather than separate capacitive circuit elements.

The dummy circuit elements 54 and 56 in the plurality of channels 15a-15n can add an additional load to the amplifier input nodes and slow down the operation of the amplifier 20 in the ADC stage 10 of FIG. 1A. To reduce the load of the dummy circuit elements 54 and 56, terminals of these devices can remain uncontacted to the transistor diffusion by eliminating the contact metal between the lowest level of interconnect metal and the transistor nodes of an integrated circuit. The lowest level of interconnect metal is typically the level of interconnect closest to a transistor, and a metal contact to the lowest level of interconnect metal is typically used to contact the transistor to higher level metal interconnects. As illustrated in FIG. 2B, the first dummy circuit element 54b-1 can be a first dummy field effect transistor and the second dummy circuit element 56b-1 can be a second dummy field effect transistor. The dummy circuit elements of FIG. 2B are provided to illustrate that the first and second dummy field effect transistors can each have a source and a drain that are not contacted by lower level interconnect metal layers, while having their gates biased to a power rail voltage. By leaving the source and/or the drain of a dummy field effect transistor uncontacted to lower level interconnect metal, the parasitic bulk-to-source capacitance $C_{BS}$ and the parasitic bulk-to-drain capacitance $C_{BD}$ of the dummy field effect transistor can be substantially eliminated. Uncontacted diffusions of the dummy field effect transistors can also substantially eliminate transistor leakage current injected on the non-inverted and inverted inputs of the amplifier 20 compared to the embodiment of FIG. 2A. Without upper level metal contacts to the diffusions of a dummy field effect transistor, the source and/or drain can be configured to float.

With the source and drain unconnected to lower level interconnect metal, the parasitic source-to-drain capacitance $C_{SD}$ of each of the dummy field effect transistors can be parasitically coupled with upper level metal across a source of one amplifier input transistor and the drain of the other amplifier input transistor in the same differential charge cancellation circuit. The parasitic source-to-drain capacitance $C_{SD}$ of a dummy field effect transistor can still be relatively closely matched and/or approximately equal to the parasitic source-to-drain capacitance of a corresponding amplifier input switch when the amplifier input switch is off, since most of the source-to-drain capacitance $C_{SD}$ is typically contributed by the lower level interconnect metal. Thus, the embodiment of FIG. 2B can reduce the load of the dummy transistors to the amplifier input nodes and the delay that they cause compared to the embodiment of FIG. 2A, while still suitably canceling differential charge as discussed above.

In the embodiment illustrated in FIG. 2C, the dummy circuit elements are implemented differently than in the embodiments of FIGS. 2A and 2B. Otherwise, the circuits illustrated in FIG. 2B can operate in substantially the same manner as the circuits illustrated in FIG. 2A. In FIG. 2B, differential charge cancellation circuits 80a and 80b include dummy circuit elements 54c-1, 56c-1, 54c-2, and 56c-2 that are implemented by capacitive circuit elements. The dummy capacitors illustrated in FIG. 2C can have capacitances that are closely matched to the source-to-drain capacitances of the amplifier input switches when the amplifier input switches are off.

Figure 3:
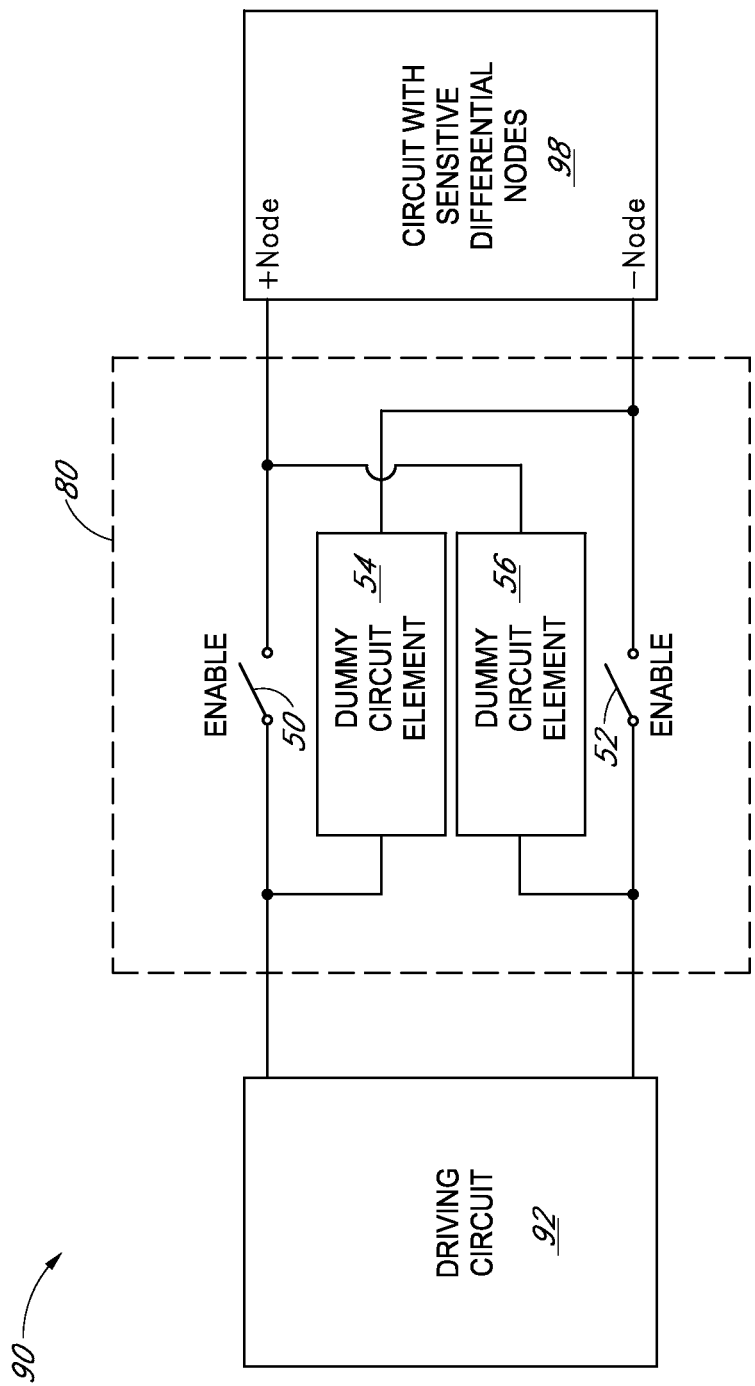
FIG. 3 is a block diagram of an electronic system having dummy circuit elements for differential charge cancellation, according to an embodiment.

With reference to FIG. 3, an electronic system having dummy circuit elements for differential charge cancellation according to an embodiment will be described. FIG. 3 illustrates an apparatus 90 that includes a driving circuit 92, a differential charge cancellation circuit 80, and a circuit with sensitive differential nodes 98. The driving circuit 92 can be any suitable circuit configured to generate differential signals. As one example, the driving circuit 92 can include the input capacitors 40 and 42 of FIG. 1A.

The illustrated differential charge cancellation circuit 80 includes a first switch 50, a second switch 52, a first dummy circuit element 54, a second dummy circuit element 56. Although the amplifier input switches 50 and 52 of FIGS. 1A and 2A-2C are configured to selectively drive amplifier inputs, it will be understood that such switches can be implemented to drive a pair of sensitive differential nodes as shown in FIG. 3. For instance, the first switch 50 can receive a first differential input from the driving circuit 92. The first switch 50 can selectively drive a non-inverted node of the circuit with sensitive differential nodes 98 responsive to an enable signal. The first switch 50 can electrically isolate a non-inverted node of the circuit with sensitive differential nodes 98 from the first differential input when off. The first switch 50 can implement any combination of features described with reference to the amplifier input switch 50 described with reference FIGS. 1A and 2A-2C.

The second switch 52 can receive a second differential input from the driving circuit 92. The second switch 52 can selectively drive an inverted node of the circuit with sensitive differential nodes 98 responsive to the enable signal. The inverted node and the non-inverted node can be a pair of sensitive differential nodes of the circuit with sensitive differential nodes 98. For instance, in one embodiment, the circuit with sensitive differential nodes 98 can be a differential amplifier, such as the amplifier 20 illustrated in FIGS. 1A and 2A-2C. The second switch 52 can electrically isolate an inverted node of the circuit with sensitive differential nodes 98 from the second differential input when off. The second switch 52 can implement any combination of features described with reference to the amplifier input switch 52 described with reference to FIGS. 1A and 2A-2C.

The first dummy circuit element 54 can inject charge on the inverted node to cancel charge injected on the non-inverted node by the first switch 52 when the first switch 52 is off. Similarly, the second dummy circuit element 56 can inject charge on the non-inverted node to cancel charge injected on the inverted node by the second switch 52 when the second switch 52 is off. In this way, differential charge can be cancelled. For instance, the first switch 52 can be biased to electrically isolate the non-inverted node from an input of the first switch 52. While the first switch 52 is biased to electrically isolate the non-inverted node from the input of the first switch 52, charge can be injected on the inverted node to cancel charge injected on the non-inverted node by the first switch 52 via the dummy circuit element 54. Such differential charge cancellation can cancel a number of glitches and unwanted charges from impacting sensitive node of a differential pair of nodes, for example, as described above.

As illustrated in FIG. 3, the first dummy circuit element 54 is coupled in series between the first differential input and the inverted node, and the second dummy circuit element 56 is coupled in series between the second differential input and the non-inverted node. In one embodiment, this coupling can be done parasitically without upper level metal contacts to the switches, for example, as described with reference to FIG. 2B. The first dummy circuit element 54 and the second dummy circuit element 56 can be cross coupled, for example, as illustrated in FIG. 3. The first dummy circuit element 54 and the second dummy circuit element 56 can implement any of the principles and advantages of the dummy circuit elements described herein, for example, with reference to FIGS. 1 and 2A-2C.

It will be understood that additional differential charge cancellation circuits including pairs of switches and pairs of dummy circuit element can be coupled in parallel with the illustrated differential charge cancellation circuit 80.

In the embodiments described above, apparatus, systems, and methods for differential charge cancellation are described in connection with particular embodiments. It will be understood, however, that the principles and advantages of the embodiments can be used for any other systems, apparatus, or methods with a need for compensating for an injection of charge on a sensitive differential node. For instance, although the embodiment illustrated in FIG. 1A is described with reference to an ADC stage, one or more features described herein can be implemented in a variety of other contexts outside of an ADC.

Such methods, systems, and/or apparatus can be implemented into various electronic devices. Examples of the electronic devices can include, but are not limited to, consumer electronic products, parts of the consumer electronic products, electronic test equipment, etc. Examples of parts of consumer electronic products can include analog-to-digital converts, amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
a first switch configured to receive a first differential input and to provide the first differential input to a first node when switched on;
a second switch configured to receive a second differential input and to provide the second differential input to a second node when switched on, wherein the first node and the second node are a differential pair of nodes;
a first dummy circuit element configured to inject charge on the second node to cancel charge injected on the first node by the first switch when the first switch is switched off; and
a second dummy circuit element configured to inject charge on the first node to cancel charge injected on the second node by the second switch when the second switch is switched off;
wherein the first switch comprises a first field effect transistor, wherein the second switch comprises a second field effect transistor, wherein the first dummy circuit element comprises a first dummy field effect transistor, wherein the second dummy circuit element comprises a second dummy field effect transistor, and wherein the first dummy field effect transistor and the second dummy field transistor each have a gate biased to a power rail voltage.

2. The apparatus of claim 1, wherein first dummy circuit element is coupled in series between the first differential input and the second node, and wherein the second dummy circuit element is coupled in series between the second differential input and the first node.

3. The apparatus of claim 1, wherein the first dummy field effect transistor has a first source configured to receive the first differential input and a first drain electrically coupled to the second node, and wherein the second dummy field effect transistor has a second source configured to receive the second differential input and a second drain electrically coupled to the first node.

4. The apparatus of claim 1, wherein the first dummy field effect transistor and the second dummy field effect transistor are substantially identical instantiations of a same transistor configuration as the first field effect transistor and the second field effect transistor.

5. The apparatus of claim 1, wherein the first dummy field effect transistor has a source and a drain that are both uncontacted by a lowest level of interconnect metal.

6. The apparatus of claim 1, wherein the first dummy circuit element has a capacitance that is approximately equal to a source to drain capacitance that the first field effect transistor has when the first field effect transistor is switched off.

7. The apparatus of claim 1, further comprising:
a third switch configured to receive a third differential input, to provide the first node when on, and to electrically isolate the first node from the third differential input when off;
a fourth switch configured to receive a fourth differential input, to provide the second node when on, and to electrically isolate the second node from the fourth differential input when off;
a third dummy circuit element configured to inject charge on the second node to cancel charge injected on the first node by the third switch when the third switch is off; and
a fourth dummy circuit element configured to inject charge on the first node to cancel charge injected on the second node by the fourth switch when the fourth switch is off.

8. The apparatus of claim 1, further comprising a differential amplifier comprising a first input electrically coupled to the first node and a second input electrically coupled to the second node.

9. An apparatus comprising an interleaved analog-to-digital converter stage, the interleaved analog-to-digital converter stage comprising:
an amplifier comprising a non-inverted input and an inverted input; and
a plurality of channels, each of the plurality of channels comprising:
a pair of amplifier input switches comprising:
a first switch configured to receive a first switch input, provide the first switch input to the non-inverted input of the amplifier when switched on, and to electrically isolate the non-inverted input of the amplifier from the first switch input when switched off; and
a second switch configured to receive a second switch input, provide the second switch input to the inverted input of the amplifier when switched on, and to electrically isolate the inverted input of the amplifier from the second switch input when switched off; and
a pair of dummy circuit elements cross coupled between the inputs of the pair of amplifier input switches and the inputs of the amplifier, each dummy circuit element of the pair of dummy circuit elements having substantially the same capacitance as the first switch when the first switch is switched off;
wherein the pair of amplifier input switches of one of the plurality of channels is configured to provide charge to the non-inverted and the inverted inputs of the amplifier, when the pair of amplifier input switches of the other of the plurality of channels are switched off.

10. The apparatus of claim 9, wherein the apparatus comprises at least one digital-to-analog converter configured to adjust charge on the first switch input and the second switch input.

11. The apparatus of claim 9, wherein the first switch comprises a first field effect transistor, wherein a first dummy circuit element of the pair of dummy circuit elements comprises a first dummy field effect transistor having a gate biased to a power rail voltage.

12. The apparatus of claim 11, wherein the first dummy field effect transistor comprises a first source and a first drain that are uncontacted by a lowest level of interconnect metal.

13. An apparatus comprising:
an amplifier comprising a non-inverted input and an inverted input; and
a plurality of channels, each of the plurality of channels comprising:
a pair of amplifier input switches comprising:
a first switch configured to receive a first switch input, provide the first switch input to the non-inverted input of the amplifier when switched on, and to electrically isolate the non-inverted input of the amplifier from the first switch input when switched off; and
a second switch configured to receive a second switch input, provide the second switch input to the inverted input of the amplifier when switched on, and to electrically isolate the inverted input of the amplifier from the second switch input when switched off; and
a pair of dummy circuit elements cross coupled between the inputs of the pair of amplifier input switches and the inputs of the amplifier, each dummy circuit element of the pair of dummy circuit elements having substantially the same capacitance as the first switch when the first switch is switched off;
wherein the pair of amplifier input switches of one of the plurality of channels is configured to provide charge to the non-inverted and the inverted inputs of the amplifier, when the pair of amplifier input switches of the other of the plurality of channels are switched off,
wherein a first dummy circuit element of the pair of dummy circuit elements of a selected channel of the plurality of channels is configured to inject charge on the inverted amplifier input to compensate for a voltage glitch on the first switch input when the selected channel is in a mode other than gain mode and a different channel of the plurality of channels is in a gain mode.

14. The apparatus of claim 13, wherein the apparatus comprises an interleaved analog-to-digital converter stage that comprises the amplifier and the plurality of channels.

15. An electronically-implemented method of reducing differential change, the method comprising:
biasing a first switch to electrically isolate a non-inverting node from an input of the first switch; and
while the first switch is biased to electrically isolate the non-inverting node from the input of the first switch, coupling charge on an inverting node to at least partially cancel charge injected on the non-inverting node by the first switch, wherein said coupling is performed by a dummy switch having a gate biased to a power rail voltage;
wherein the non-inverting node and the inverting node comprise nodes of a differential pair.

16. The method of claim 15, wherein the dummy switch is electrically coupled to the input of the first switch.

17. The method of claim 15, further comprising sensing a difference between charge on the non-inverted node and charge on the inverted node.

18. An electronically-implemented method of reducing differential change, the method comprising:
biasing a first switch to electrically isolate a non-inverting node from an input of the first switch; and
while the first switch is biased to electrically isolate the non-inverting node from the input of the first switch, coupling charge on an inverting node to at least partially cancel charge injected on the non-inverting node by the first switch;
wherein the non-inverting node and the inverting node comprise nodes of a differential pair,
wherein the method is performed for sampling in an analog-to-digital converter having a plurality of interleaved channels, and wherein the method further comprises:
turning on amplifier input switches including the first switch of a first channel of a plurality of interleaved channels to provide a sample to the non-inverting node; and
while the amplifier input switches of the first channel are turned on,
biasing amplifier input switches of the others of the plurality of interleaved channels to be switched off, the others of the plurality of interleaved channels comprising at least a second channel; and
activating switches of the second channel to charge capacitors of the second channel with inputs to the second channel.

19. The apparatus of claim 1, wherein the first switch, the second switch, the first dummy circuit element, and the second dummy circuit element are arranged in an interleaved analog-to-digital converter stage.

20. The apparatus of claim 1, further comprising at least one digital-to-analog converter configured to adjust charge on the first differential input and the second differential input.

21. The apparatus of claim 20, further comprising a capacitor coupled between the at least one digital-to-analog converter and the first switch, wherein the digital-to-analog converter is configured to charge the capacitor.

22. The apparatus of claim 13, wherein the mode other than gain mode is an acquisition mode.

23. The apparatus of claim 13, wherein the apparatus comprises at least one digital-to-analog converter configured to adjust charge on the first switch input and the second switch input.

24. The method of claim 18, wherein coupling is performed by a capacitor having a capacitance approximately equal to an off state capacitance of the first switch.

* * * * *